(12) United States Patent
Song et al.

(10) Patent No.: US 12,189,429 B2
(45) Date of Patent: Jan. 7, 2025

(54) DISPLAY DEVICE

(71) Applicant: Samsung Display Co., LTD., Yongin-si (KR)

(72) Inventors: Ju Hee Song, Seoul (KR); Sang Jae Kim, Seongnam-si (KR); Dong-Hee Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 220 days.

(21) Appl. No.: 17/862,686

(22) Filed: Jul. 12, 2022

(65) Prior Publication Data

US 2023/0135958 A1    May 4, 2023

(30) Foreign Application Priority Data

Nov. 3, 2021 (KR) .......................... 10-2021-0149869

(51) Int. Cl.
*G06F 1/16* (2006.01)

(52) U.S. Cl.
CPC .......... *G06F 1/1652* (2013.01); *G06F 1/1616* (2013.01); *G06F 1/1656* (2013.01)

(58) Field of Classification Search
None
See application file for complete search history.

(56) References Cited

U.S. PATENT DOCUMENTS

| | | | | |
|---|---|---|---|---|
| 5,665,835 | A * | 9/1997 | Epple | C09J 133/066 |
| | | | | 526/318 |
| 11,348,487 | B2 * | 5/2022 | Lee | G02F 1/133308 |
| 2011/0169022 | A1 * | 7/2011 | Shiota | G02F 1/13452 |
| | | | | 438/119 |
| 2021/0193962 | A1 * | 6/2021 | Song | B32B 15/046 |
| 2022/0173354 | A1 * | 6/2022 | Song | H10K 59/8793 |

FOREIGN PATENT DOCUMENTS

| | | |
|---|---|---|
| JP | 6888730 | 6/2021 |
| KR | 1020160091526 | 8/2016 |
| KR | 1020200119340 | 10/2020 |
| KR | 1020210008262 | 1/2021 |

* cited by examiner

*Primary Examiner* — Courtney L Smith
(74) *Attorney, Agent, or Firm* — CANTOR COLBURN LLP

(57) ABSTRACT

A display device includes: a display panel; a driver IC positioned on the display panel; a supporting member positioned under the display panel; and a lower adhesive layer positioned between the display panel and the supporting member. A storage modulus of the lower adhesive layer is about 0.020 MPa to about 0.030 MPa at about 1 Hz and about 140° C.

20 Claims, 6 Drawing Sheets

DISPLAY DEVICE

This application claims priority to Korean Patent Application No. 10-2021-0149869, filed on Nov. 3, 2021, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device is a device for displaying an image, and includes a liquid crystal display ("LCD"), an organic light emitting diode ("OLED") display, or the like. The display device is used in various electronic devices such as a mobile phone, a navigation device, a digital camera, an electronic book, a portable game machine, and various terminals.

This display device includes a display panel including a plurality of pixels, and a driver for supplying a signal to the plurality of pixels. In the display panel, a plurality of gate lines and a plurality of data lines are formed, and each pixel is connected to a gate line and a data line to receive predetermined signals. The driver may include a gate driver and a data driver. The gate line receives a gate signal from the gate driver, and the data line receives a data signal from the data driver.

Such a driver may be formed in a form of a driver integrated circuit ("IC") chip. The driver IC may be attached to one edge of the display panel in a chip-on-panel ("COP") method. At this time, if the bonding between the display panel and the driver IC is not properly performed, a bonding resistance increases which may adversely affect the operation of the display device.

A flexible display device capable of being bent or folded, which can be reduced in weight and thickness, and which can be increased in portability, is being developed. The flexible display device may be implemented by using a flexible substrate such as plastic instead of a glass substrate.

SUMMARY

A support member such as a film may be attached to protect the display device, and an adhesive layer may be positioned between the display device and the support member. In the process of attaching the driver IC to the display panel, heat and pressure are applied, which may cause deformation such as pressing or pushing the adhesive layer. If the display device is bent or folded while the adhesive layer is deformed, cracks may occur in the display device.

Embodiments are to provide a display device capable of preventing cracks from occurring in the process of implementing the flexible display device.

A display device according to an embodiment includes: a display panel; a driver IC positioned on the display panel; a supporting member positioned under the display panel; and a lower adhesive layer positioned between the display panel and the supporting member, where a storage modulus of the lower adhesive layer is about 0.020 megapascals (MPa) to about 0.030 MPa at about 1 hertz (Hz) and about 140 degrees in Celsius (° C.).

The storage modulus of the lower adhesive layer may be about 0.08 MPa to about 0.2 MPa at about 1 Hz and about −20° C.

The storage modulus of the lower adhesive layer may be about 0.035 MPa to about 0.050 MPa at about 1 Hz and about 25° C.

A thickness of the lower adhesive layer may be about 15 micrometers (μm) to about 25 μm.

The display panel may include a display area and a peripheral area, and the driver IC may be positioned in the peripheral area.

The display device according to an embodiment further includes an anisotropic conductive film positioned between the display panel and the driver IC, and the driver IC may be attached to the display panel by the anisotropic conductive film.

A process of attaching the driver IC to the display panel may be performed for 5 seconds at a temperature of about 190° C. and a pressure of about 10 MPa to about 40 MPa.

The display device according to an embodiment further includes: a protection member positioned on the display panel; a window positioned on the protection member; a window protection member positioned on the window; a first adhesive layer positioned between the window protection member and the window; a second adhesive layer positioned between the window and the protection member; and a third adhesive layer positioned between the protection member and the display panel.

The supporting member may include: a first supporting member positioned under the display panel, a second supporting member positioned under the first supporting member, and a third supporting member positioned under the second supporting member, and the lower adhesive layer may include: a fourth adhesive layer positioned between the display panel and the first supporting member, a fifth adhesive layer positioned between the first supporting member and the second supporting member, and a sixth adhesive layer positioned between the second supporting member and the third supporting member.

The storage modulus of the fourth adhesive layer may be about 0.020 MPa to about 0.030 MPa at about 1 Hz and about 140° C.

The storage modulus of the fourth adhesive layer may be about 0.08 MPa to about 0.2 MPa at about 1 Hz and about −20° C.

The storage modulus of the fourth adhesive layer may be about 0.035 MPa to about 0.050 MPa at about 1 Hz and about 25° C.

A thickness of the fourth adhesive layer may be about 15 μm to about 25 μm.

The first supporting member and the second supporting member may include a polymer resin, and the third supporting member may include glass, plastic, or metal.

The third supporting member may include a folding structure, and the folding structure may be one of a pattern portion where an opening is defined therein, a protrusions and depressions area, and links connected to each other to be rotatable.

The lower adhesive layer may be made of a photocurable adhesive.

The lower adhesive layer may include an acryl resin with a photoinitiator.

The lower adhesive layer may be made of a thermosetting adhesive.

The lower adhesive layer may be made of a liquid adhesive that hardens when heat of about 100° C. to about 140° C. is applied.

The display device may be a flexible display device.

According to embodiments, it is possible to prevent the adhesive layer from being pressed or pushed in the process of attaching the driver IC to the display panel. Therefore, it is possible to effectively prevent cracks from occurring in the process of implementing the flexible display device.

DETAILED DESCRIPTION

Figure 1:
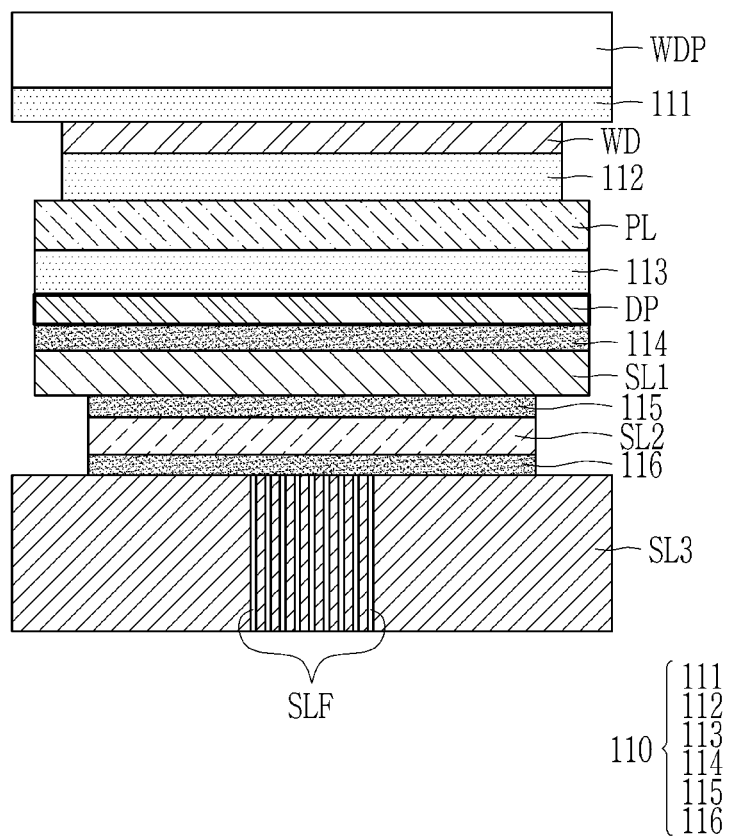
FIG. 1 is a cross-sectional view showing a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a cross-section" means viewing a cross-section formed by vertically cutting a target portion from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, a display device according to an embodiment is described with reference to FIG. 1.

FIG. 1 is a cross-sectional view showing a display device according to an embodiment.

As shown in FIG. 1, a display device according to an embodiment may include a window protection member WDP, a window WD, a protection member PL, a display panel DP, a first supporting member SL1, a second supporting member SL2, a third supporting member SL3, and an adhesive layer 110 positioned between these as shown in FIG. 1.

In the present embodiment, the adhesive layer 110 may include a first adhesive layer 111, a second adhesive layer 112, a third adhesive layer 113, a fourth adhesive layer 114, a fifth adhesive layer 115, and a sixth adhesive layer 116. The adhesive layer 110 may be a pressure sensitive adhesive ("PSA"). In the present embodiment, the adhesive layer 110 may be divided into an upper adhesive layer positioned above the display panel DP and a lower adhesive layer positioned below the display panel DP. The upper adhesive layer may include the first adhesive layer 111, the second adhesive layer 112, and the third adhesive layer 113, and the lower adhesive layer may include the fourth adhesive layer 114, the fifth adhesive layer 115, and the sixth adhesive layer 116.

In the present embodiment, physical properties of the first adhesive layer 111, the second adhesive layer 112, the third adhesive layer 113, the fourth adhesive layer 114, the fifth adhesive layer 115, and the sixth adhesive layer 116 may be different from each other. The physical properties of each adhesive layer 110 may be appropriately selected in consideration of the characteristic of the material of the constituent elements in contact with each adhesive layer 110, the position of each adhesive layer 110, or the like. At least some of the several adhesive layers 110 may have the same physical properties.

The protection member PL may be positioned on the display panel DP. The protection member PL may be attached to the upper surface of the display panel DP through the third adhesive layer 113. That is, the third adhesive layer 113 may be positioned between the display panel DP and the protection member PL.

The protection member PL may be positioned on the display panel DP to protect the display panel DP from external impact. The protection member PL may be made of a polymer resin. For example, the protection member PL may include a polymer resin such as polyethersulfone, polyacrylate, polyether imide, polyethylene naphthalate, polyethylene terephthalate, polyphenylene sulfide, polyarylate, polyimide, polycarbonate, or cellulose acetate propionate. However, the present invention is not limited thereto. The protection member PL may be made of a material such as glass or quartz in another embodiment.

The window WD may be positioned on the top of the protection member PL. The window WD may be attached to the upper surface of the protection member PL through the second adhesive layer 112. That is, the second adhesive layer 112 may be positioned between the protection member PL and the window WD.

The window WD may be made of glass. However, the present invention is not limited thereto. The window WD may include a polymer resin in another embodiment.

The window protection member WDP may be disposed on the window WD. The window protection member WDP may be attached to the upper surface of the window WD through the first adhesive layer 111. That is, the first adhesive layer 111 may be positioned between the window WD and the window protection member WDP. The window protection member WDP may protect the window WD from external impact, and may prevent or minimize occurrence of scratches on the upper surface of the window WD. The window protection member WDP may include a polymer resin. However, the present invention is not limited thereto, and the window protection member WDP may include an inorganic material in another embodiment.

The first supporting member SL1 may be positioned under the display panel DP. The first supporting member SL1 may be attached to the lower surface of the display panel DP through the fourth adhesive layer 114. That is, the fourth adhesive layer 114 may be positioned between the display panel DP and the first supporting member SL1. The first supporting member SL1 is disposed under the display panel DP to support the display panel DP and protect the display panel DP from external impact. The first supporting member SL1 may be made of a polymer resin such as polyethylene terephthalate or polyimide.

The second supporting member SL2 may be positioned below the first supporting member SL1. The second supporting member SL2 may be attached to the first supporting member SL1 via the fifth adhesive layer 115. That is, the fifth adhesive layer 115 may be positioned between the first supporting member SL1 and the second supporting member SL2. The second supporting member SL2 may be positioned under the display panel DP to support the display panel DP.

The second supporting member SL2 may be made of a polymer resin such as polyethylene terephthalate or polyimide.

The third supporting member SL3 may be positioned under the second supporting member SL2. The third supporting member SL3 may be attached to the second supporting member SL2 through the sixth adhesive layer 116. That is, the sixth adhesive layer 116 may be positioned between the second supporting member SL2 and the third supporting member SL3. The third supporting member SL3 may be disposed under the display panel DP to support the display panel DP.

In an embodiment, the third supporting member SL3 may include a folding structure SLF. The folding structure SLF may have a variable shape or a variable length when the display device is folded. For example, the folding structure SLF may include a pattern part with openings, a protrusions and depressions shape, or links connected to each other to be rotatable. However, the present invention is not limited thereto, and the shape of the folding structure SLF may be variously changed.

In an embodiment, the third supporting member SL3 may include at least one of glass, plastic, and metal. In an embodiment, the third supporting member SL3 may be made of polyurethane or carbon fiber reinforced plastic ("CFRP"). In an embodiment, the folding structure SLF may include the same material as the third supporting member SL3, or may include a different material from the third supporting member SL3.

The display device according to an embodiment may include a driver IC attached to the display panel in a chip-on-panel ("COP") manner.

Next, a process of attaching the driver IC to the display panel DP of the display device according to an embodiment is described with reference to FIG. 2 and FIG. 3.

Figure 2:
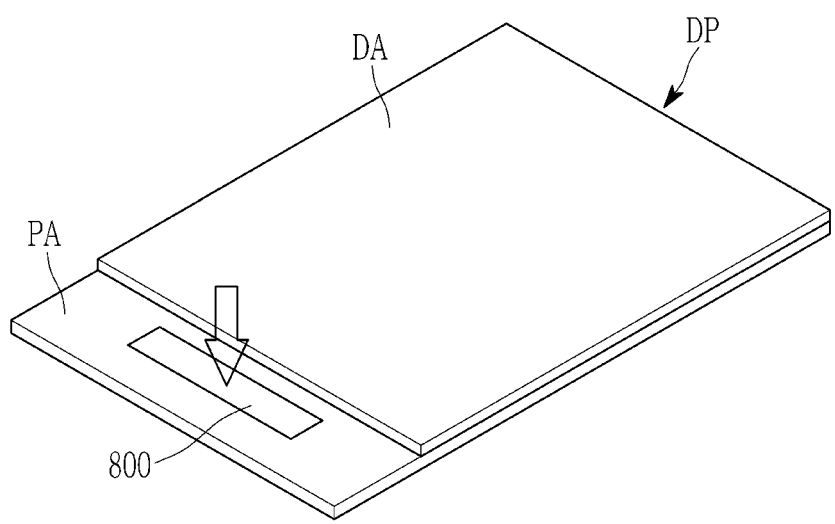
FIG. 2 and FIG. 3 are perspective views schematically showing a manufacturing process of a display device according to an embodiment.
Figure 3:
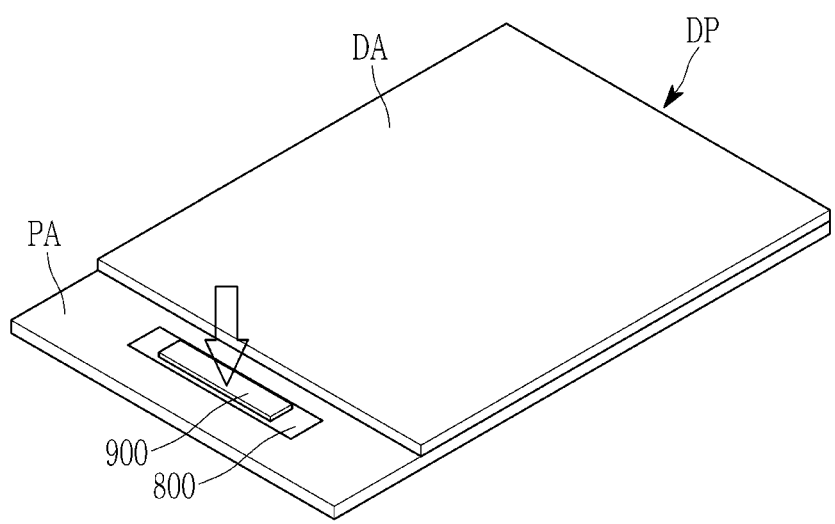

FIG. 2 and FIG. 3 are perspective views schematically showing a manufacturing process of a display device according to an embodiment. FIG. 2 and FIG. 3 show the process of attaching the driver IC to the display panel of the display device according to an embodiment.

As shown in FIG. 2, the display panel DP of the display device according to an embodiment may include a display area DA and a peripheral area PA. The display area DA is an area in which a screen (i.e., image) is displayed, and a plurality of pixels are disposed in the display area DA. The peripheral area PA is an area in which a driving circuit for driving a plurality of pixels positioned in the display area DA is mounted. The display panel DP is made of flexible material and may be changed into various forms. The display panel DP may be flexible, stretchable, foldable, bendable, or rollable.

An anisotropic conductive film 800 having conductivity only in the thickness direction may be attached on the peripheral area PA of the display panel DP. As used herein, the "thickness direction" of a film or layer is defined as a distance between an upper major surface plane and a lower major surface plane of the film or layer, and a "plan view" is defined as a view in the thickness direction. The peripheral area PA may have a rectangular shape including approximately two long sides and two short sides in a plan view. The anisotropic conductive film 800 may have a rectangular shape including approximately two long sides and two short sides in a plan view. In this case, the anisotropic conductive film 800 may have a shape of which a longitudinal direction is parallel to the long side of the peripheral area PA.

Next, as shown in FIG. 3, a driver IC 900 is positioned on the anisotropic conductive film 800 and heat and pressure are applied thereto, thereby attaching the driver IC 900 to the display panel DP. The attachment process of driver IC 900 may be performed for about 5 seconds at a temperature of about 190 degrees in Celsius (° C.) and a pressure of about 10 megapascals (MPa) to about 40 MPa. The anisotropic conductive film 800 is positioned between the driver IC 900 and the display panel DP, and the driver IC 900 may be attached to the display panel DP by the anisotropic conductive film 800. The driver IC 900 may include an input bump, an output bump, etc., and an input pad, an output pad, etc. may be disposed to the peripheral area PA of the display panel DP. The input bump of the driver IC 900 and the input pad of the display panel DP may be electrically connected to each other by the anisotropic conductive film 800. Similarly, the output bump of the driver IC 900 and the output pad of the display panel DP may be electrically connected to each other by the anisotropic conductive film 800.

In the process of attaching the driver IC 900, heating and pressurization may be performed, and constituent elements positioned under the display panel DP may be affected by this environment. For example, the fourth adhesive layer 114, the fifth adhesive layer 115, and the sixth adhesive layer 116 positioned under the display panel DP may be affected. Among them, the fourth adhesive layer 114 may be most affected by the heating and pressing. For example, the fourth adhesive layer 114 may be pressed or pushed by the heating and pressurization, and thus the fourth adhesive layer 114 may be lifted in some areas. Due to this, if the flexible display device is folded or bent, cracks may occur in the display device. When the attachment process of the driver IC 900 is performed at a temperature of about 190° C., the location where the fourth adhesive layer 114 is positioned may exhibit a temperature of about 140° C. to about 150° C. Therefore, by appropriately selecting the physical properties of the fourth adhesive layer 114 at a temperature of about 140° C., it is possible to prevent the deformation of the fourth adhesive layer 114 and prevent cracks from occurring.

Hereinafter, the physical properties of the fourth adhesive layer 114, which is an adhesive layer positioned closest to the bottom surface of the display panel DP, is described. By appropriately selecting the physical properties of the fourth adhesive layer 114 at a temperature of about 140° C., it is possible to improve the folding characteristic while not being affected by the attachment process of the driver IC 900.

The thickness of the fourth adhesive layer 114 may be greater than or equal to about 15 micrometers (μm) and less than or equal to about 25 μm. If the thickness of the fourth adhesive layer 114 is too thin, for example, less than about 15 the adherence of the fourth adhesive layer 114 may be lowered. In the display device according to an embodiment, the adhesive force between the display panel DP and the first supporting member SL1 may be improved by forming the thickness of the fourth adhesive layer 114 to be about 15 μm or more. If the thickness of the fourth adhesive layer 114 is too thick, for example, if it is formed to exceed about 25 μm, the folding characteristic may deteriorate, and the fourth adhesive layer 114 may be pressed or pushed in the process of attaching the driver IC. In the display device according to an embodiment, by forming the thickness of the fourth adhesive layer 114 to about 25 μm or less, the folding characteristic of the flexible display device may be improved, and the deformation of the fourth adhesive layer 114 may be effectively prevented in the process of attaching the driver IC.

The fourth adhesive layer 114 may be formed of a photocurable adhesive. That is, the fourth adhesive layer 114 may be formed of an adhesive that is cured when being irradiated with ultraviolet rays or visible rays of a specific wavelength (200 nanometers (nm)-400 nm) region. The fourth adhesive layer 114 may include acryl resin. A photoinitiator may be contained in the acryl resin. However, the present invention is not limited thereto, and the fourth adhesive layer 114 may be made of a different material. For example, the fourth adhesive layer 114 may be formed of a thermosetting adhesive in another embodiment. That is, the fourth adhesive layer 114 may be formed of an adhesive that is cured when heat is applied. In this case, heat of about 100° C. to about 140° C. may be applied, and the fourth adhesive layer 114 may be made of a liquid adhesive.

At about 1 hertz (Hz) and about −20° C., a storage modulus of the fourth adhesive layer 114 may be greater than or equal to about 0.08 MPa and less than or equal to about 0.2 MPa. By forming the storage modulus of the fourth adhesive layer 114 at a low-temperature within the above-described range, the folding reliability of the display device may be effectively improved.

At about 1 Hz and about 25° C., the storage modulus of the fourth adhesive layer 114 may be greater than or equal to about 0.035 MPa and less than or equal to about 0.050 MPa. By setting the storage modulus of the fourth adhesive layer 114 at the room-temperature within the above-described range, it is possible to prevent defects from occurring in the punching of the display device and the LFC process.

At about 1 Hz and about 140° C., the storage modulus of the fourth adhesive layer 114 may be greater than or equal to about 0.020 MPa and less than or equal to about 0.030 MPa. By setting the storage modulus of the fourth adhesive layer 114 at a high temperature within the above-described range, the process stability may be improved in the process of attaching the driver IC 900 of the display device.

The physical properties of the fourth adhesive layer 114 of the display device according to an embodiment will be described with reference to Table 1 and FIG. 4, in comparison with a reference example.

Figure 4:
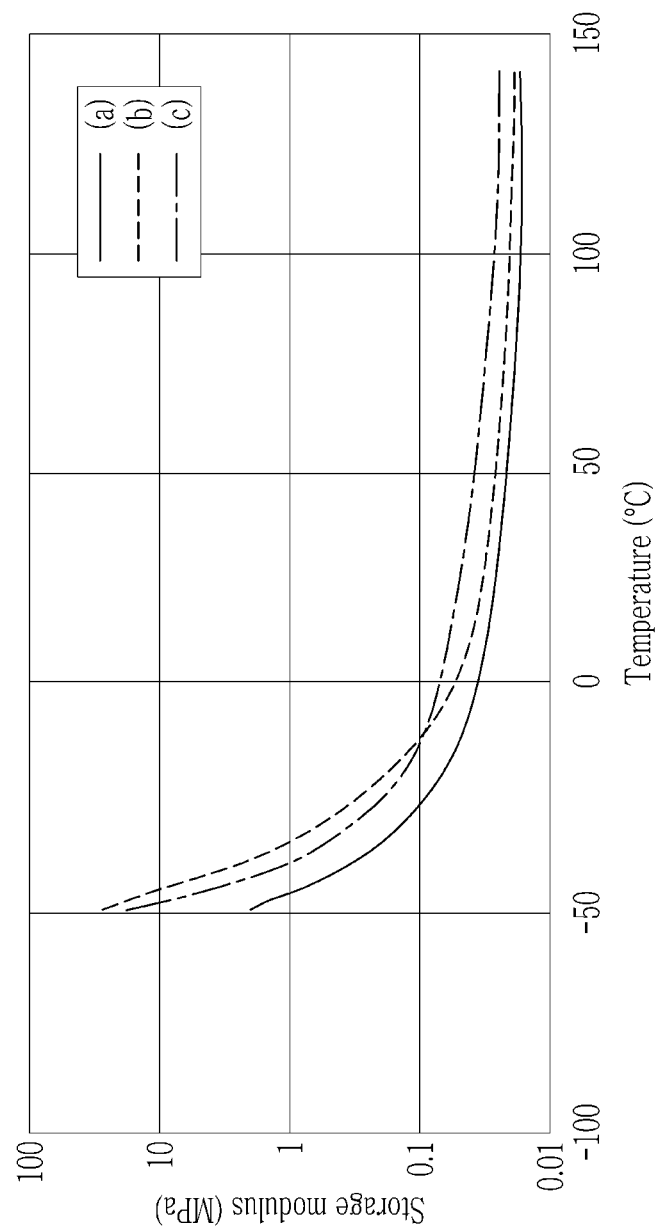
FIG. 4 is a graph showing a storage modulus of each material according to a temperature.

Table 1 is a table showing physical properties of the fourth adhesive layer 114 of a display device according to an embodiment and a reference example, and FIG. 4 is a view showing a part of Table 1 as graphs. FIG. 4 is graphs showing a storage modulus of each material according to a temperature. In this case, (c) represents the fourth adhesive layer 114 of the display device according to an embodiment, and remaining (z), (a), and (b) represent other reference examples.

TABLE 1

| | Thickness | Storage modulus for each temperature (kPa) | | | | |
|---|---|---|---|---|---|---|
| | (μm) | −20° C. | 25° C. | 60° C. | 85° C. | 140° C. |
| (z) | 18 | 500 | 50 | 33 | 26 | 21 |
| (a) | 25 | 71.5 | 26.5 | 20.1 | 17.6 | 17.1 |
| (b) | 15 | 201.8 | 32.5 | 24.1 | 21.2 | 18.4 |
| (c) | 15 | 150.2 | 48.1 | 34.1 | 28.4 | 24.2 |

As shown in Table 1 and FIG. 4, as the temperature increases, the storage modulus tends to decrease. The storage modulus decreases rapidly between about −50° C. and about 0° C., and then the storage modulus tends to decrease gradually between about 0° C. and about 150° C. The reference example (z) has the high storage modulus of 500 kilopascals (kPa) at −20° C. The reference example (z) may deteriorate the folding characteristic by the high storage modulus.

In the case (c) representing the fourth adhesive layer 114 of the display device according to an embodiment, the storage modulus at a high-temperature of about 140° C. keeps to a 24.2 kPa level, so that the process stability in the process of attaching the driver IC of the display device may be improved.

Referring to the reference example (a) and the reference example (b), as the storage modulus at a high temperature is relatively high, it is common that the storage modulus at a low temperature is also relatively high. In the case (c) of the fourth adhesive layer 114 of the display device according to an embodiment, although the storage modulus at a high temperature is somewhat high, the storage modulus at −20° C., which is a low temperature, may have a relatively low value as the level of 150.2 kPa. Therefore, the display device according to an embodiment may improve the folding characteristic at a low temperature (e.g., −20° C.) while improving the process stability at a high temperature (e.g., 100° C.).

Hereinafter, a test result according to the pressure applied to the display device to which the reference example (b) and the fourth adhesive layer (c) of the display device according to an embodiment are applied is described with reference to Table 2 below.

Table 2 is a table showing whether the display device is normally driven according to the change in a pressure applied to the display device and the resistance at the part where the driver IC is attached in cases of using heat-resistant PET and using a high-functionality (e.g., high heat resistance, durability) film as a first supporting member to the display device to which the reference example (b) and the fourth adhesive layer (c) of the display device according to an embodiment are applied. In this case, the thickness of the fourth adhesive layer may be about 15 μm.

Referring to Table 2, it may be confirmed that the probability that the normal operation is not performed increases as the pressure applied to the display device increases. (OK: a normal operation, N/D: operation error occurrence)

In addition, it may be confirmed that the resistance decreases as the pressure applied to the display device increases, and an open (OPEN) occurs in some cases. In the case (c) according to an embodiment, it may be confirmed that the stable operation is performed compared to the reference example (b) and that it is advantageous in terms of resistance. From this, it may be confirmed that the driving and the resistance are affected by the physical properties of the fourth adhesive layer 114.

Hereinafter, the properties of the fourth adhesive layer (c) of the display device according to the reference examples and an embodiment and the characteristics of the display device according thereto are compared and described with reference to Table 3.

Table 3 is a table showing a thickness, a low-temperature storage modulus, a room-temperature storage modulus, a high-temperature storage modulus of the reference example (y), the reference example (z), the reference example (i), the reference example (j), the reference example (a), the reference example (b), and the fourth adhesive layer (c) of the display device according to an embodiment, and adhesion, a folding characteristic, and process stability in the display device to which they are applied. The low-temperature storage modulus means the storage modulus at about 1 Hz and about −20° C., the room-temperature storage modulus means the storage modulus at about 1 Hz and about 25° C., and the high-temperature storage modulus means the storage modulus at about 1 Hz and about 140° C. The folding characteristic indicates whether or not cracks occur in the display device when the display device is folded or bent, and the process stability means the stability in the process of attaching the driver IC. The folding characteristic and the process stability show good characteristics in order of X, Δ, ○, and ◎. That is, "X" means bad and ◎ means the best.

TABLE 2

| | | Fourth adhesive | | | | | | |
|---|---|---|---|---|---|---|---|---|
| | | (b) | | | | (c) | | |
| | | First supporting member | | | | | | |
| | | Heat-resistance PET | | High functionality film | | Heat-resistance PET | | High functional film | |
| Item | | Driving | Resistance | Driving | Resistance | Driving | Resistance | Driving | Resistance |
| Pressure | 10 MPa | OK | 0.94 | N/D | 0.82 | OK | 0.67 | OK | 0.69 |
| | 15 MPa | OK | 0.98 | OK | 1.12 | OK | 0.63 | OK | 0.53 |
| | 20 MPa | N/D | 0.75 | OK | 0.56 | OK | 0.53 | OK | 0.43 |
| | 25 MPa | OK | 0.65 | N/D | OPEN | OK | 0.42 | OK | 0.48 |
| | 30 MPa | N/D | 0.73 | N/D | OPEN | N/D | 0.30 | OK | 0.49 |
| | 35 MPa | N/D | OPEN | N/D | 0.27 | N/D | 0.33 | N/D | 0.51 |

TABLE 3

| Items | (y) | (z) | (i) | (j) | (a) | (b) | (c) |
|---|---|---|---|---|---|---|---|
| Thickness (μm) | 13 | 15-18 | 15-18 | 25 | 25 | 15 | 15 |
| Low-temperature storage modulus (MPa) | >50 | 0.5 | 0.5 | 0.1-0.2 | 0.07-0.1 | 0.1-0.2 | 0.1-0.2 |
| Room-temperature storage modulus (MPa) | — | 0.50 | 0.50 | 0.035 | 0.021 | 0.032 | 0.048 |
| High-temperature storage modulus (MPa) | — | 0.021 | 0.021 | 0.017 | 0.017 | 0.024 | 0.028 |
| Adhesion | >300 | >300 | >300 | >300 | >300 | >300 | >300 |
| Folding characteristic | X | X | X | ◎ | ◎ | ◎ | ◎ |
| Process stability | ◎ | ○ | ○ | Δ | Δ | ○ | ◎ |

Referring to Table 3, in the case of the reference example (y), the reference example (z), and the reference example (i), which have the high low-temperature storage modulus while having the relatively thin thickness, it may be confirmed that the folding characteristic is not good. In the case of the reference example (j), the reference example (a), the reference example (b), and the embodiment (c) having the relatively thick thickness or the low low-temperature storage modulus, it may be confirmed that the folding characteristic is good. In addition, in the case of the reference example (j) and the reference example (a), which have the relatively thick thickness and the low high-temperature storage modulus, the process stability is low. In the case of the reference example (z), the reference example (i), the reference example (b), and the embodiment (c), which have the high high-temperature storage modulus while having the relatively thick thickness, it may be confirmed that the process stability is moderate or high. Particularly, in the case of the embodiment (c), in which the high-temperature storage modulus has the highest value, it is confirmed that the process stability is best.

As such, when comprehensively considering the characteristics of the display device according to the physical properties of the fourth adhesive layer, the embodiment (c) has the good folding characteristic and the highest process stability. That is, in the display device according to an embodiment, the folding characteristic and the process stability of the display device may be simultaneously improved by relatively lowering the low-temperature storage modulus and relatively increasing the high-temperature storage modulus while forming the thickness of the fourth adhesive layer to be thin.

Next, the display device according to an embodiment is described with reference to FIG. 5 and FIG. 6.

Figure 5:
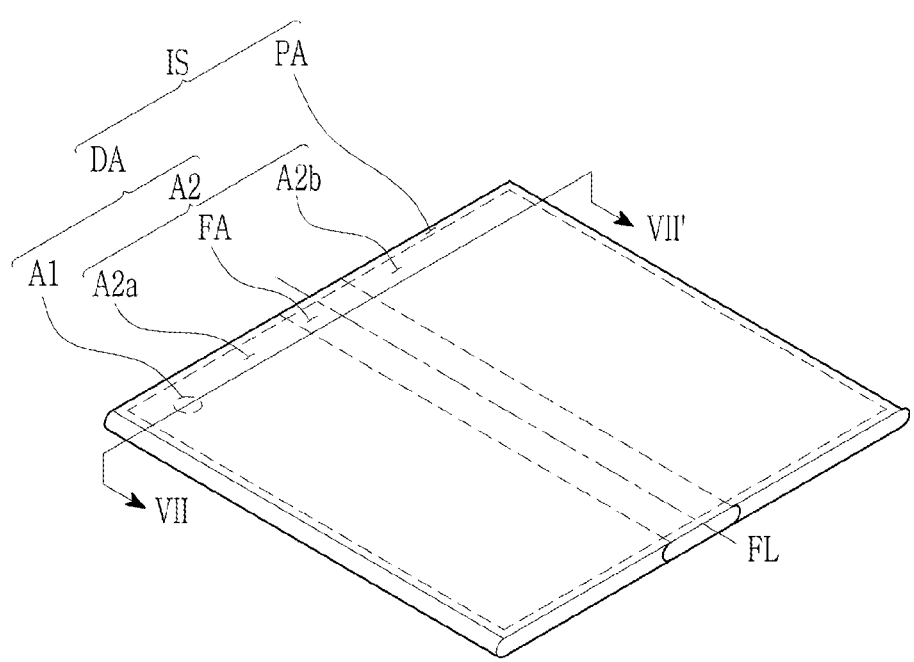
FIG. 5 is a perspective view schematically showing a display device according to an embodiment.
Figure 6:
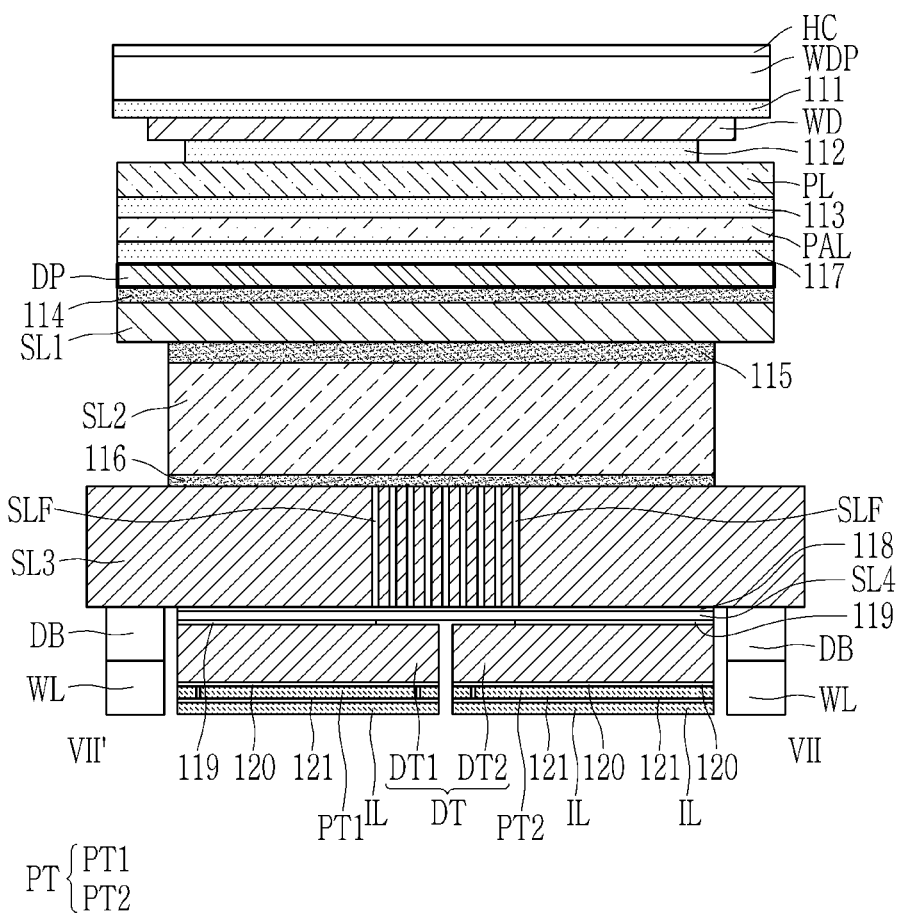
FIG. 6 is a cross-sectional view of a display device taken along line VII-VII' of FIG. 5 according to an embodiment.

FIG. 5 is a perspective view schematically showing a display device according to an embodiment, and FIG. 6 is a cross-sectional view of a display device taken along line VII-VII' of FIG. 5 according to an embodiment. FIG. 5 is a view showing a case where the display device is a foldable display device, FIG. 6 is a view to explain a stacking relationship of members constituting the display device, and in FIG. 6, the members constituting the display device are simply shown.

As shown in FIG. 5, the display device according to an embodiment may be a foldable display device. The display device may be folded around the folding axis FL. In an embodiment, the display surface IS of the display device may be positioned outside or inside the display device.

The display panel of the display device according to an embodiment may include a display area DA and a peripheral area PA. The display area DA may be an area in which an image is displayed, and may also be an area in which an external input is sensed. The display area DA may be an area in which a plurality of pixels to be described later are disposed.

The display area DA may include a first area A1 and a second area A2. Also, the second area A2 may include a second-first area A2a, a second-second area A2b, and a folding area FA. The second-first area A2a and the second-second area A2b may be positioned on the left and right, respectively, with respect to the folding axis FL, and the folding area FA may be positioned between the second-first area A2a and the second-second area A2b. However, the present invention is not limited thereto, and the number and position of each area constituting the display area DA may be variously changed.

The first area A1 may have relatively high light transmittance compared to the second area A2. Also, the first area A1 may have a relatively smaller area than the second area A2. The first area A1 may be defined as an area overlapping the area where the electronic module is disposed inside the housing among the display panel. In an embodiment, the first area A1 is shown in the shape of a circle in a plan view, but the present invention is not limited thereto. The first area A1 may have various shapes, such as polygons, ellipses, and figures with at least one curved line in a plan view in another embodiment.

The display device may receive an external signal through the first area A1 or may provide an output signal to the outside.

Referring to FIG. 6, the display device according to an embodiment includes a window protection member WDP, a window WD, a protection member PL, a polarization layer PAL, a display panel DP, a first supporting member SL1, a second supporting member SL2, a third supporting member SL3, a fourth supporting member SL4, a digitizer DT, a plate PT, an insulating film IL, a step member DB, a waterproof member WL, and an adhesive layer 110 positioned between the above structures. In the present embodiment, the adhesive layer 110 may include a first adhesive layer 111, a second adhesive layer 112, a third adhesive layer 113, a fourth adhesive layer 114, a fifth adhesive layer 115, a sixth adhesive layer 116, and a seventh adhesive layer 117.

Among them, the description for the window protection member WDP, the window WD, the protection member PL, the display panel DP, the first supporting member SL1, the second supporting member SL2, the third supporting member SL3, and the first adhesive layer 111 to the sixth adhesive layer 116 is the same as that of FIG. 1 so that the detailed description for the same constituent elements is omitted.

The display device according to an embodiment in FIG. 6 may further include a hard coating layer HC positioned on the window protection member WDP. The hard coating layer HC may be made of an organic material such as a polymer resin. However, the present invention is not limited thereto. The hard coating layer HC may be made of an inorganic material in another embodiment.

The hard coating layer HC may be the outermost layer (e.g., uppermost) of the display device. The hard coating layer HC may be a layer directly touched by the user, and when the outermost layer of the display device is the window or the window protection member WDP, the user's touch feeling may deteriorate. Since the outermost layer of the display device is made of the hard coating layer HC in this embodiment, it may provide a smooth and soft touch feeling to the user.

The display device according to an embodiment may further include a polarization layer PAL positioned between the protection member PL and the display panel DP. The polarization layer PAL may be attached to the display panel DP through the seventh adhesive layer 117. That is, the seventh adhesive layer 117 may be positioned between the polarization layer PAL and the display panel DP. The protection member PL may be attached to the polarization layer PAL through the third adhesive layer 113. That is, the third adhesive layer 113 may be positioned between the protection member PL and the polarization layer PAL. According to an embodiment, the polarization layer PAL and the seventh adhesive layer 117 may be omitted.

The fourth supporting member SL4 may be further positioned below the third supporting member SL3. The fourth supporting member SL4 may be attached to the fourth supporting member SL4 through an eighth adhesive layer 118. That is, the eighth adhesive layer 118 may be positioned between the third supporting member SL3 and the fourth supporting member SL4.

The digitizer DT may be further positioned under the fourth supporting member SL4. The digitizer DT may be adhered to the fourth supporting member SL4 through a ninth adhesive layer 119. That is, the ninth adhesive layer 119 may be positioned between the fourth supporting member SL4 and the digitizer DT.

The digitizer DT may include a body layer and/or a pattern layer. The digitizer DT may detect a signal input from an external electronic pen or the like through the pattern layer. Particularly, the digitizer DT may detect the intensity and the direction of the signal input from the electronic pen, etc.

When the digitizer DT is provided integrally, cracks may occur in the body layer and/or the pattern layer of the digitizer DT when the display device is folded. In an embodiment, the digitizer DT may include a first digitizer DT1 positioned to the left of the folding axis FL and a second digitizer DT2 positioned to the right of the folding axis FL. Accordingly, it is possible to prevent cracks from occurring in the process of folding the display device.

The first digitizer DT1 may at least partially overlap the second-first area A2a in a plan view shown in FIG. 5, and the second digitizer DT2 may at least partially overlap the second-second area A2b. Also, the first digitizer DT1 may at least partially overlap the folding area FA, and the second digitizer DT2 may at least partially overlap the folding area FA in a plan view.

In an embodiment, the first digitizer DT1 and the second digitizer DT2 may be spaced apart from each other with the folding axis FL therebetween. That is, the digitizer DT may be provided as a separate type rather than an integral type. Since the digitizer DT is provided in the separable-type structure, it is possible to prevent or minimize cracks from occurring in the body layer and/or the pattern layer disposed in the folding area FA.

In addition, the digitizer DT is provided as the separate type, but the digitizer DT provided as the separate type is provided to at least partially overlap the folding area FA in a plan view, so that the signals may be input even in the folding area FA, thereby the user's convenience may be improved.

The plate PT may be positioned under the digitizer DT. The plate PT may be adhered to the lower surface of the digitizer DT through the tenth adhesive layer 120. That is, the tenth adhesive layer 120 may be positioned between the digitizer DT and the plate PT. In an embodiment, the tenth adhesive layer 120 may not be provided in the portion corresponding to the folding area FA.

The plate PT may transfer the heat generated by the digitizer DT to the outside. In this case, the plate PT may include a metal with good heat transfer efficiency. Alternatively, the plate PT may be made of graphite having high thermal conductivity in the thickness direction. When the plate PT is provided with graphite, the plate PT may be provided with a thinner thickness than when the plate PT is provided with a metal. In addition, the plate PT may be disposed under the digitizer DT to support the digitizer DT and protect the digitizer DT from external impact.

The plate PT may include a first plate PT1 positioned to the left of the folding axis FL and a second plate PT2 positioned to the right of the folding axis FL.

The insulating film IL may be positioned under the plate PT. The insulating film IL may be adhered to the plate PT through the eleventh adhesive layer 121. That is, the eleventh adhesive layer 121 may be positioned between the plate PT and the insulating film IL.

The step member DB and the waterproof member WL may be positioned on the outside of the fourth supporting member SL4, the digitizer DT, the plate PT, and the insulating film IL.

The waterproof member WL may prevent or minimize the components of the display device from being damaged by blocking or absorbing moisture inflowing from the outside of the display device. At this time, the waterproof member WL may be made of a tape, a sponge, or the like.

The step member DB may compensate for the step while being positioned between the waterproof member WL and the third supporting member SL3.

If necessary, the fifth adhesive layer 115, the second supporting member SL2, the sixth adhesive layer 116, the third supporting member SL3, the eighth adhesive layer 118, the fourth supporting member SL4, the ninth adhesive layer 119, the digitizer DT, the tenth adhesive layer 120, the plate PT, the eleventh adhesive layer 121, and the insulating film IL may include a through-hole corresponding to the first area A1, respectively.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

110: adhesive layer
114: fourth adhesive layer
800: anisotropic conductive film
900: driver IC
DP: display panel
SL1: first supporting member

What is claimed is:

1. A display device comprising:
a display panel;
a driver integrated circuit (IC) positioned on the display panel;
a supporting member positioned under the display panel; and
a lower adhesive layer positioned between the display panel and the supporting member,
wherein a storage modulus of the lower adhesive layer is about 0.020 megapascals (MPa) to about 0.030 MPa at 1 hertz (Hz) and 140 degrees in Celsius (° C.),
wherein the supporting member includes:
a first supporting member positioned under the display panel, and
a second supporting member positioned under the first supporting member, and
the lower adhesive layer includes:
a fourth adhesive layer positioned between the display panel and the first supporting member, and
a fifth adhesive layer positioned between the first supporting member and the second supporting member.

2. The display device of claim 1, wherein
the storage modulus of the lower adhesive layer is about 0.08 MPa to about 0.2 MPa at 1 Hz and −20° C.

3. The display device of claim 2, wherein
the storage modulus of the lower adhesive layer is about 0.035 MPa to about 0.050 MPa at 1 Hz and 25° C.

4. The display device of claim 3, wherein
a thickness of the lower adhesive layer is about 15 micrometers (μm) to about 25 μm.

5. The display device of claim 1, wherein
the display panel includes a display area and a peripheral area, and
the driver IC is positioned in the peripheral area.

6. The display device of claim 5, further comprising
an anisotropic conductive film positioned between the display panel and the driver IC,
wherein the driver IC is attached to the display panel by the anisotropic conductive film.

7. The display device of claim 6, wherein
a process of attaching the driver IC to the display panel is performed for 5 seconds at a temperature of 190° C. and a pressure of about 10 MPa to 40 MPa.

8. The display device of claim 1, further comprising:
a protection member positioned on the display panel;
a window positioned on the protection member;
a window protection member positioned on the window;
a first adhesive layer positioned between the window protection member and the window;
a second adhesive layer positioned between the window and the protection member; and
a third adhesive layer positioned between the protection member and the display panel.

9. The display device of claim 1, wherein
the supporting member further includes:
a third supporting member positioned under the second supporting member, and
the lower adhesive layer further includes:
a sixth adhesive layer positioned between the second supporting member and the third supporting member.

10. The display device of claim 9, wherein
storage modulus of the fourth adhesive layer is about 0.020 MPa to about 0.030 MPa at 1 Hz and 140° C.

11. The display device of claim 10, wherein
the storage modulus of the fourth adhesive layer is about 0.08 MPa to about 0.2 MPa at 1 Hz and −20° C.

12. The display device of claim 11, wherein
the storage modulus of the fourth adhesive layer is about 0.035 MPa to about 0.050 MPa at 1 Hz and 25° C.

13. The display device of claim 12, wherein
a thickness of the fourth adhesive layer is about 15 μm to about 25 μm.

14. The display device of claim 9, wherein
the first supporting member and the second supporting member include a polymer resin, and
the third supporting member includes glass, plastic, or metal.

15. The display device of claim 14, wherein
the third supporting member includes a folding structure, and
the folding structure is one of a pattern portion where an opening is defined therein, a protrusions and depressions area, and links connected to each other to be rotatable.

16. The display device of claim 1, wherein
the lower adhesive layer is made of a photocurable adhesive.

17. The display device of claim 16, wherein
the lower adhesive layer includes an acryl resin with a photoinitiator.

18. The display device of claim 1, wherein
the lower adhesive layer is made of a thermosetting adhesive.

19. The display device of claim 18, wherein
the lower adhesive layer is made of a liquid adhesive that hardens when heat of about 100° C. to about 140° C. is applied.

20. The display device of claim 1, wherein
the display device is a flexible display device.

* * * * *